United States Patent
Kuo et al.

(10) Patent No.: US 8,660,432 B2
(45) Date of Patent: Feb. 25, 2014

(54) IMAGE-ROTATION PRISMS AND OPTICAL INTERCONNECTS EMPLOYING THE SAME

(75) Inventors: Huei Pei Kuo, Cupertino, CA (US);
Robert G. Walmsley, Palo Alto, CA (US); Shih-Yuan Wang, Palo Alto, CA (US); Michael Renne Ty Tan, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 566 days.

(21) Appl. No.: 12/922,098

(22) PCT Filed: Apr. 2, 2008

(86) PCT No.: PCT/US2008/004362
§ 371 (c)(1),
(2), (4) Date: Sep. 10, 2010

(87) PCT Pub. No.: WO2009/123591
PCT Pub. Date: Oct. 8, 2009

(65) Prior Publication Data
US 2011/0013913 A1 Jan. 20, 2011

(51) Int. Cl.
*H04B 10/00* (2013.01)
(52) U.S. Cl.
USPC .......................................... 398/131; 398/160
(58) Field of Classification Search
USPC ............... 398/130–131, 156, 160; 359/211.1, 359/219.1–219.2, 833–834
See application file for complete search history.

(56) References Cited

U.S. PATENT DOCUMENTS

| | | | |
|---|---|---|---|
| 5,191,485 A | 3/1993 | Kahle | |
| 5,214,528 A * | 5/1993 | Akanabe et al. | 359/211.1 |
| 6,339,506 B1 * | 1/2002 | Wakelin et al. | 359/648 |
| 6,782,160 B2 | 8/2004 | Townsend | |
| 7,416,352 B2 * | 8/2008 | Goutzoulis et al. | 385/89 |
| 2007/0237528 A1 * | 10/2007 | Popp | 398/184 |

FOREIGN PATENT DOCUMENTS

| | | |
|---|---|---|
| JP | S49-114928 | 11/1974 |
| JP | S50-034552 | 4/1975 |
| JP | S55-087105 | 7/1980 |
| JP | S59-116703 | 7/1984 |
| JP | H10-274791 | 10/1998 |
| JP | 2822428 | 11/1998 |
| JP | 2001-141913 | 5/2001 |
| JP | 2007-193009 | 8/2007 |

OTHER PUBLICATIONS

Hewlett-Packard Development Company, LP., Application No. PCT/US2008/004362, Filed Apr. 2, 2008, PCT International Search Report mailed Sep. 30, 2008.

* cited by examiner

*Primary Examiner* — Leslie Pascal

(57) ABSTRACT

Embodiments of the present invention relate to a family of image-rotation prisms. Each image-rotation prism has the property that as an image-rotation prism is rotated, an image passing through the image-rotation prism rotates at twice the angular rate of the image-rotation prism. Embodiments of the present invention include optical systems that can be used for board-to-board communications and employ the image-rotation prisms to compensate for arbitrary axial rotations and misalignment of optical signals and can be used to direct optical signals output from transmitters on one board to particular detectors of a detector arrangement located on an adjacent board.

20 Claims, 13 Drawing Sheets

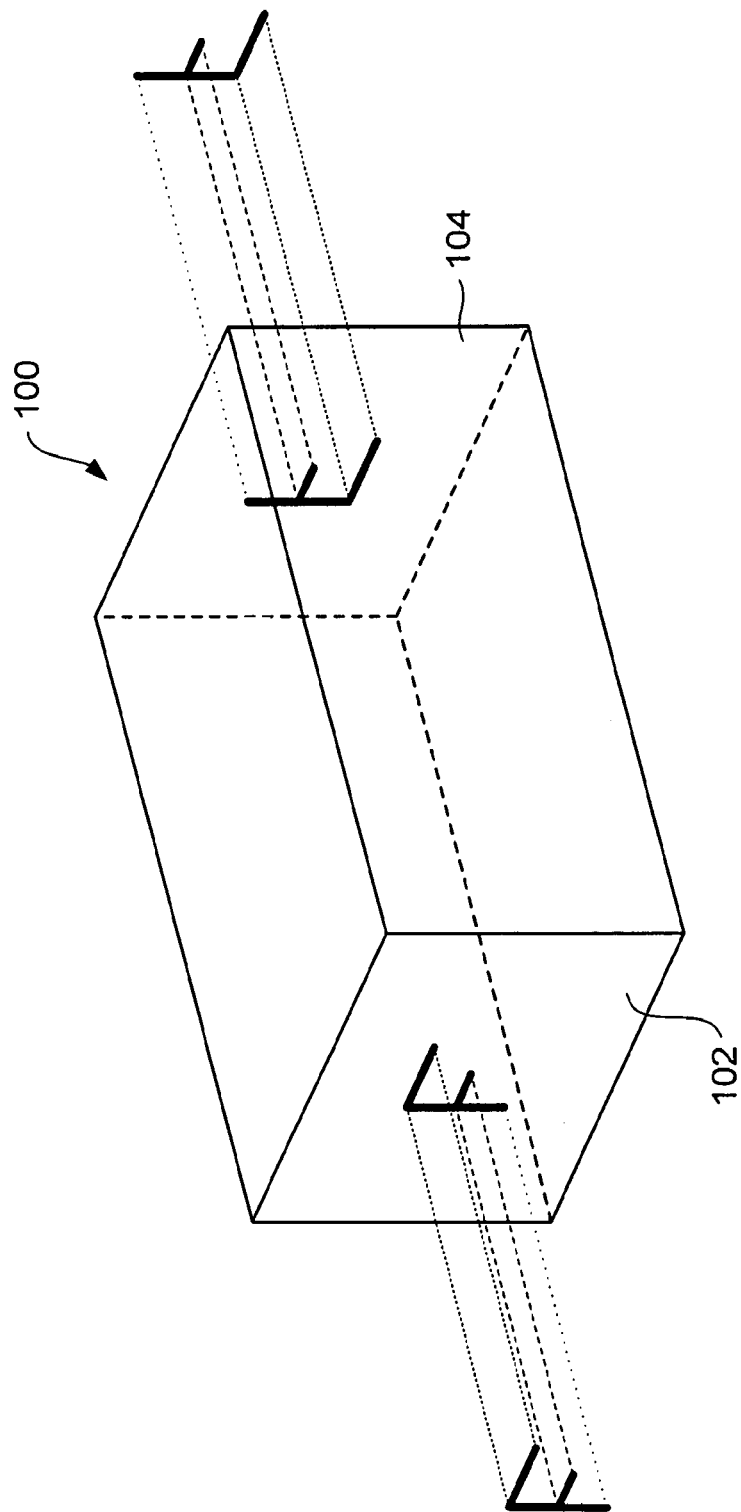

IMAGE-ROTATION PRISMS AND OPTICAL INTERCONNECTS EMPLOYING THE SAME

TECHNICAL FIELD

Embodiments of the present invention relate to optics, and, in particular, to a family of prisms configured to invert images and to optical interconnects configured to employ the family of prisms.

BACKGROUND

High data rate signal transmission is a concern in many systems. Current server systems, for example, often use a set of user-selected components that need to communicate with each other at high data rates. In a server system using blades, for example, the blades, such as server blades and storage blades, are mounted in a common enclosure and share system components such as cooling fans, power supplies, and enclosure management. For the blades to work together and provide the desired data storage, processing, and communications, the server system needs to provide high data rate communication channels for communications between blades.

Data channels using electrical signaling generally require high frequency electrical signals to provide high data transmission rates, and the high frequency oscillations can present impedance and noise problems for electrical signals transmitted over conductors such as copper wires. Data channels using optical signaling can avoid many of these problems, but guided optical signaling may require complex waveguides and/or dealing with loose optical cables or ribbons. The optical cables or ribbons may introduce space and reliability issues in systems such as servers. Free-space optical signaling avoids impedance and noise problems associated with electrical signals and avoids the need for waveguides or optical cables. However, use of a free-space optical data channel in a system such as a server generally requires the ability to precisely align an optical transmitter and an optical detector and the ability to maintain the alignment in an environment that may experience mechanical and thermal variations. The challenges of establishing and maintaining alignment for free-space optical data channels can multiply when multiple data optical channels are needed. Accordingly, systems and methods for economically and efficiently establishing and maintaining multiple free-space optical channels are desired.

BRIEF DESCRIPTION OF THE DRAWINGS

FIGS. 1A-1B show a general representation of an image-rotation prism configured in accordance with embodiments of the present invention.

DETAILED DESCRIPTION

Embodiments of the present invention relate to a family of image-rotation prisms and to optical interconnects employing the image-rotation prisms to compensate for arbitrary axial rotation and misalignment of optical signals and to direct optical signals onto particular detectors of an arrangement of detectors. The optical interconnects are free space interconnects that have the potential advantage of providing board-to-board communication and interconnect topologies that are not practical with conventional wire-based interconnects. The optical interconnects also provide high bandwidth, low propagation loss, electromagnetic interference immunity, and potentially low power consumption when compared with conventional wire-based interconnects. Employing the optical interconnects in board-to-board communication with an aggregate bandwidth of about 120 Gb/s requires a minimal number of actuators to compensate for board-to-board misalignment of about ±1-3 mm in plane offset, about ±4-6 mm board-to-board spacing variation, and about ±3-5° of angular offset (pitch/yaw). The optical interconnects can be modular for insertion into various system architectures.

The optical interconnects employ a lens and an image-rotation prism with unity image magnification. A first lens is positioned to receive optical signals output from a number of light sources arrange on a first board, and the second lens is positioned to direct the optical signals onto a number of detectors arranged on a second board. Each lens is mechanically coupled to an actuator that adjusts the orientation of the lens to compensate for pitch and yaw misalignment. An image-rotation prism is disposed between the first lens and the second lens and can be adjusted to compensate for arbitrary axial rotation and misalignments of the light sources and detector arrangements. The prism image roll can also be used to align optical signals with particular detectors of a detector arrangement mounted on a board.

Figure 1B:
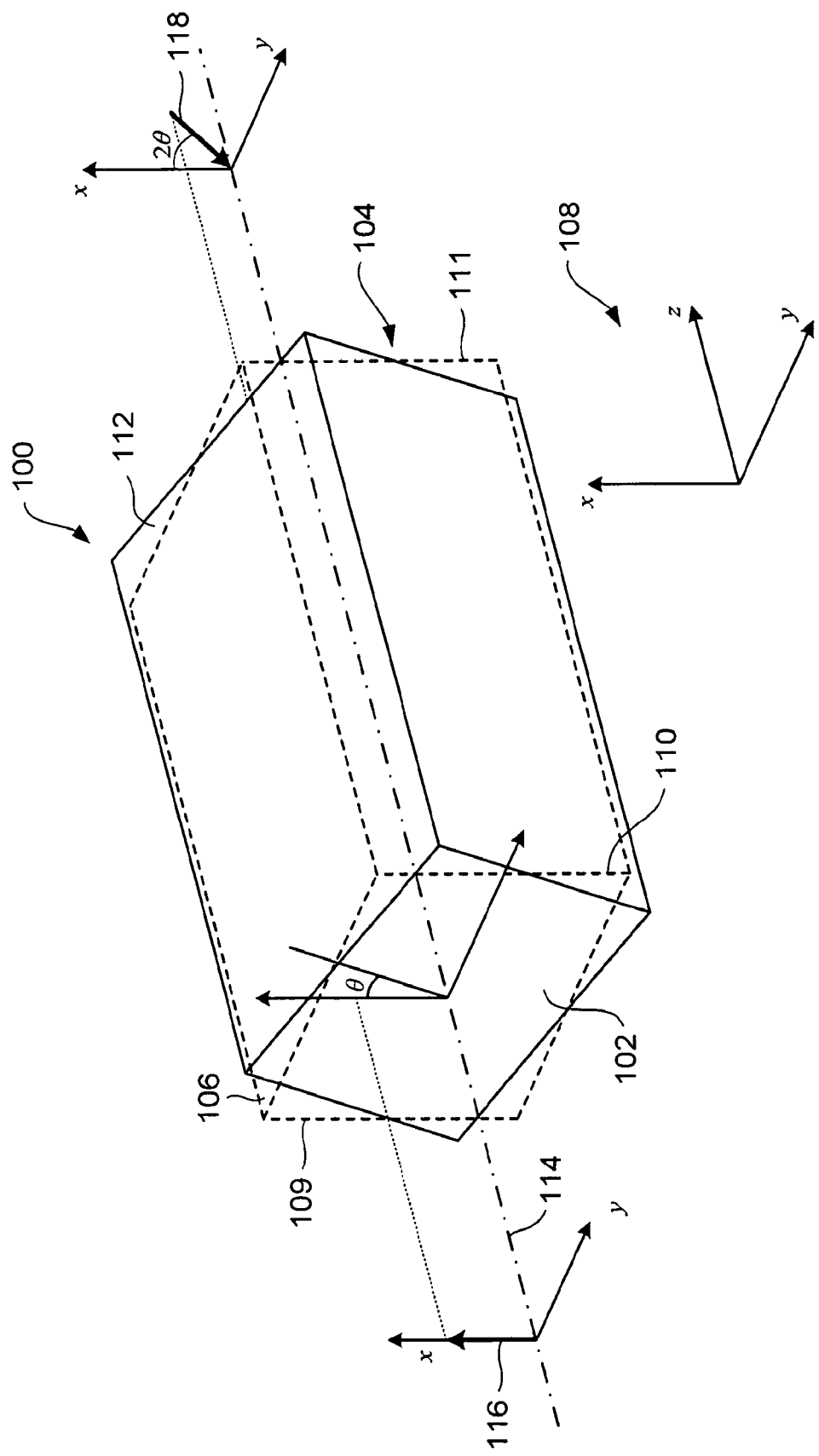

FIGS. 1A-1B show a general representation of an image-rotation prism 100 configured in accordance with embodiments of the present invention. The image-rotation prism 100 includes a first planar surface 102, a second planar surface 104, and a plurality of intermediate planar surfaces (not shown). The first planar surface 102 and the second planar surface 104 are located on opposite ends of the image-rotation prism 100. The intermediate planar surfaces are not represented in FIGS. 1A-1B because the orientation and number of the intermediate planar surfaces varies from one image-rotation prism to the next within the image-rotation prism embodiments of the present invention, and because the general representation of the image-rotation prism 100 is all that is needed to first describe two fundamental optical properties associated with all image-rotation prism embodiments of the present invention. Three specific image-rotation prism embodiments are described in greater detail below with reference to FIGS. 3-7.

A first optical property of the image-rotation prism 100 is that an image incident on the first planar surface 102 emerges inverted from the second planar surface 104. For example, as shown in FIG. 1A, an image of the letter "F" is incident on the first planar surface 102 of the image-rotation prism 100, and an inverted image of the letter "F" emerges from the second planar surface 104.

A second optical property of the beamsplitter 100 is that when the beamsplitter 100 is rotated about an axis that is perpendicular to the first and second planar surfaces 102 and 104, the axis running through the center of the image-rotation prism 100, the image incident on the first planar surface 102 emerges from the second planar surface 104 rotated by twice the rotation angle of the image-rotation prism 100. For example, as shown in FIG. 1B, a dashed-line block 106 represents the image-rotation prism 100 in a first position. The first and second planar surfaces 102 and 104 are perpendicular to the z-axis of a Cartesian coordinate system 108, and vertical edges 109-111 are parallel to the x-axis. Block 112 represents the same image-rotation prism 100 rotated into a second position through an angle θ about an axis 114 that is parallel to the z-axis of the Cartesian coordinate system 108. The axis 114 runs through the middle of the blocks 106 and 112 and is perpendicular to the first planar surface 102 and the second planar surface 104. Directional arrow 116 is directed along the x-axis and represents the orientation of an image incident on the first planar surface 102. The image emerges from the second planar surface 104 rotated through an angle 2θ to the x-axis and is inverted in accordance with the first optical property.

Figure 2:
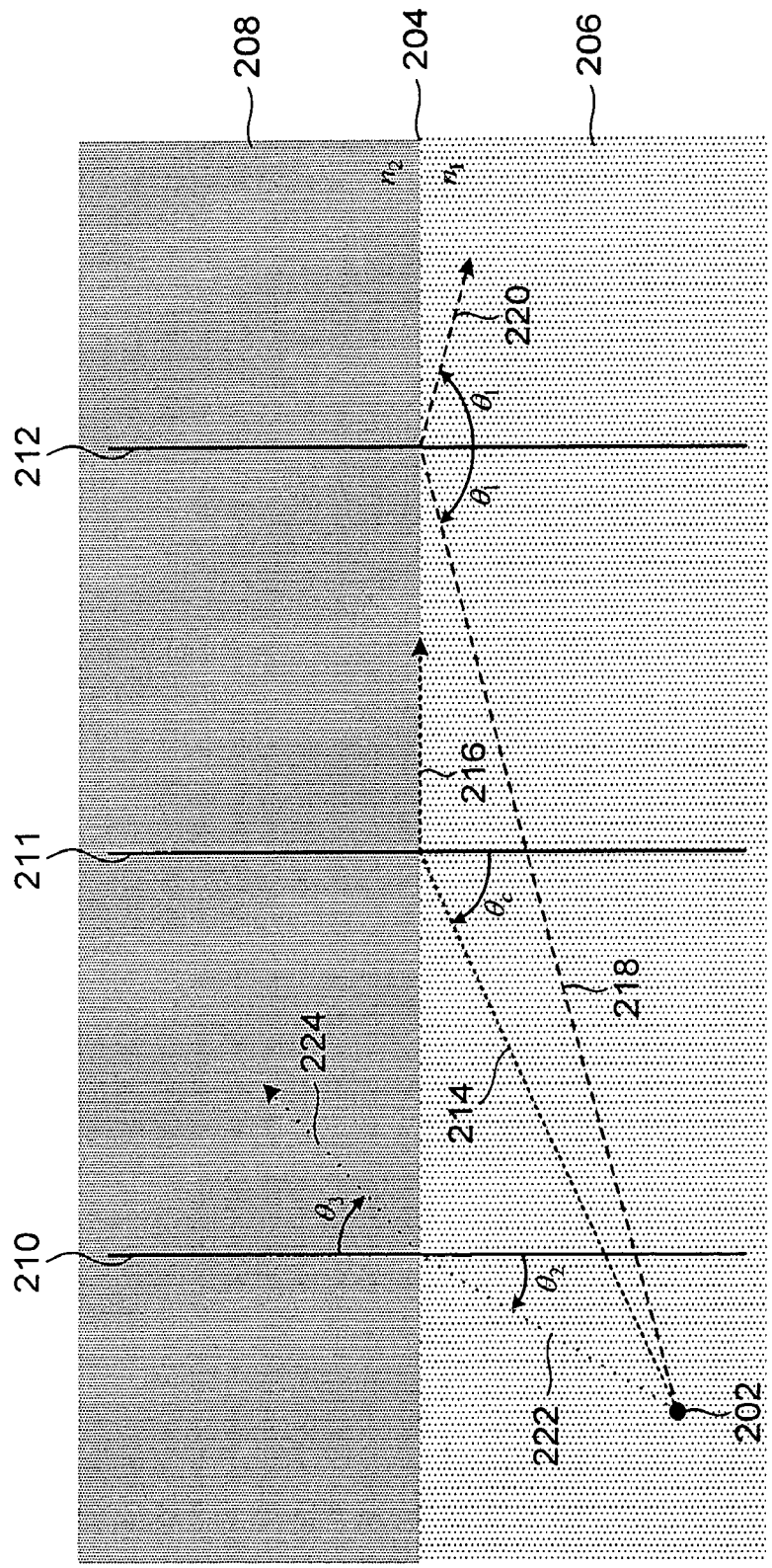
FIG. 2 shows optical properties of an interface between two different materials.

Light propagating through the image-rotation prism 100 encounters the intermediate planar surfaces at various angles with respect to the path of the light. A certain number of the intermediate planar surfaces can be angled so that the light transmitted along a particular path experiences total internal reflection at these intermediate planar surfaces, and a number of other intermediate planar surfaces are angled so that the light transmitted along a particular path is partially internally reflected. FIG. 2 shows optical properties of an interface between two different materials, each of which has a different index of refraction. In FIG. 2, a point source 202 emits light in all directions. Rays, identified by directional arrows, are used to represent the direction of column or beams of light propagation through space or an optical medium material. Each ray has an associated angle-of-incidence with an interface 204 between a first material 206 and a second material 208. The angle-of-incidence is the angle between a ray and an imaginary line called a "normal," which is a perpendicular line to the interface 204 and intersects the interface 204 at the point where the ray is incident on the interface 204. Perpendicular lines 210-212 represent normals that are associated with three rays emanating from the source 202. The first material 206 is assumed to have a larger refractive index $n_1$ than the refractive index $n_2$ of the second material 208. For example, the first material 206 can be composed of glass or acrylic, the second material 208 can be air, and the interface 204 can represent the planar surface of a prism, such as the prisms described below. A ray 214 with a particular angle-of-incidence $\theta_c$ results in a refracted ray 216 directed along the surface of the first material 206. The angle $\theta_c$ is called the "critical angle." Patterns of rays with an angle-of-incidence greater than the critical angle $\theta_c$ are reflected in a process called "total internal reflection" ("TIR"). Rays with an angle-of-incidence that are less than the critical angle $\theta_c$ are refracted and pass from the first material 206 into the second material 208 with an angle-of-refraction that is greater than the angle-of-incidence. For example, a ray 218 has an angle-of-incidence $\theta_1$ that is greater than the critical angle $\theta_c$ resulting in a reflected ray 220 reflecting off of the interface 204 with the same angle $\theta_1$, in accordance with the Law of Reflection. On the other hand, a ray 222 has an angle-of-incidence $\theta_2$ that is less than the critical angle $\theta_c$ resulting in a refracted ray 224 emerging from the first material 210 with an angle-of-refraction $\theta_3$, where $\theta_3 > \theta_2$ in accordance with the Law of Refraction.

Figure 3A:
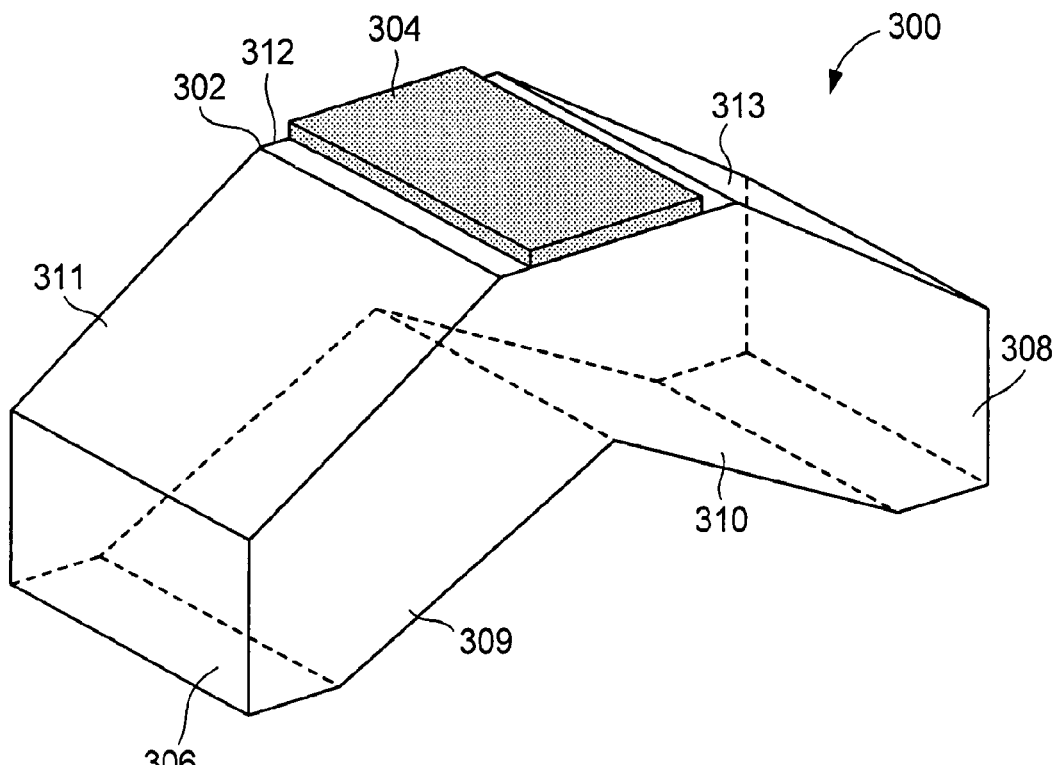
FIG. 3A shows an isometric view of a first image-rotation prism configured in accordance with embodiments of the present invention.
Figure 3B:
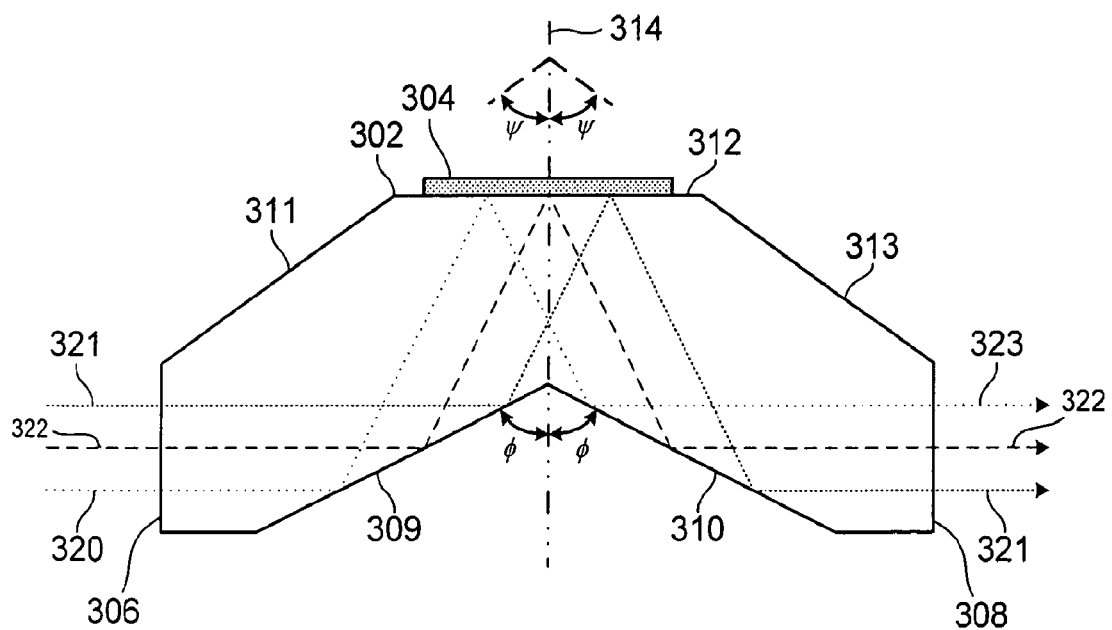
FIG. 3B shows a side-view of the image-rotation prism, shown in FIG. 3A, configured in accordance with embodiments of the present invention.

FIG. 3A shows an isometric view of a first image-rotation prism 300 configured in accordance with embodiments of the present invention. The image-rotation prism 300 includes a prism 302 and a mirror 304. The prism 302 is configured with a first planar surface 306, a second planar surface 308, and intermediate planar surfaces 309-313. The mirror 304 is disposed on at least a portion of the planar surface 312. FIG. 3B shows a side-view of the image-rotation prism 300 configured in accordance with embodiments of the present invention. Dashed-line 314 represents a side-view of a plane-of-symmetry positioned perpendicular to the planar surface 312 and bisecting the prism 302. The first and second planar surface 306 and 308 are ideally parallel to the plane 314, the planar surfaces 309 and 310 are also ideally configured with the same angle ø to the plane 314, and the planar surfaces 311 and 313 are ideally configured with the same angle ψ to the plane 314. When the prism 302 is mirrored through the plane-of-symmetry 314, the resulting orientation of the prism 302 is ideally physically indistinguishable from the initial orientation of the prism 302.

As shown in FIG. 3B, three different rays 321-323, identified by three different dashed lines, trace a path of portions of a beam of light entering the prism 302 substantially perpendicular to the first planar surface 306. The planar surface 309 is angled so that the rays 321-323 experience TIR at the planar surface 309 and are reflected toward the planar surface 312 with an angle-of-incidence that is less than the critical angle associated with the planar surface 312. The mirror 304 reflects the rays 321-323 to the planar surface 310, which is angled so that the rays 321-323 experience TIR and emerge from the prism 302 substantially perpendicular to the second planar surface 308. Note that because the rays 321-323 experience an odd number of internal reflections, the rays 321-323 emerge from the prism 302 inverted with respect to the incident orientation of the rays 321-323.

Figure 4:
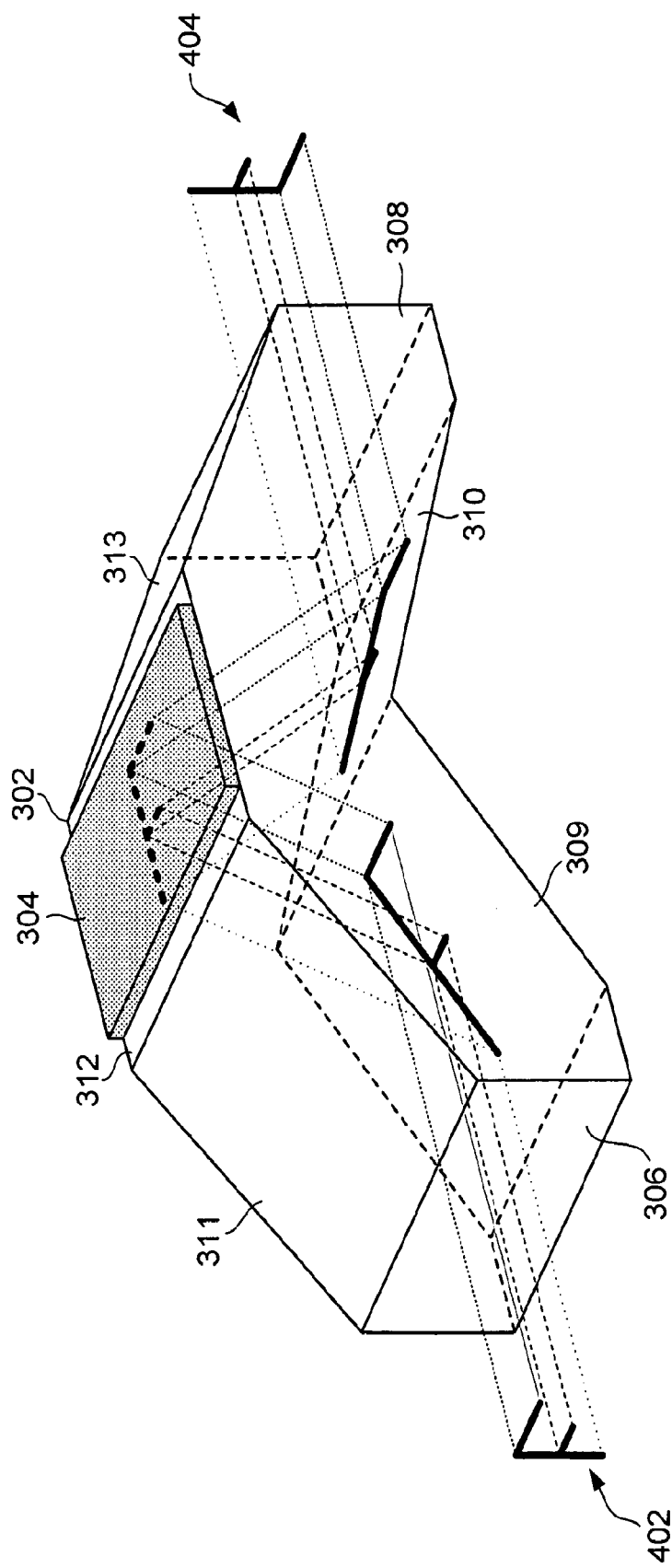
FIG. 4 shows an isometric view of inverting an image using the image-rotation prism, shown in FIG. 3A, in accordance with embodiments of the present invention.

FIG. 4 shows an isometric view of inverting an image using the image-rotation prism 300 in accordance with embodiments of the present invention. The image of the letter "F" 402 enters the prism 302 through the first planar surface 306 and undergoes three internal reflections before emerging from the prism 302 as an inverted image of the letter "F" 404. The internal reflections at the planar surfaces 309 and 310 are due to TIR, and the internal reflection at the planar surface 312 is due to the mirror 304.

Figure 5A:
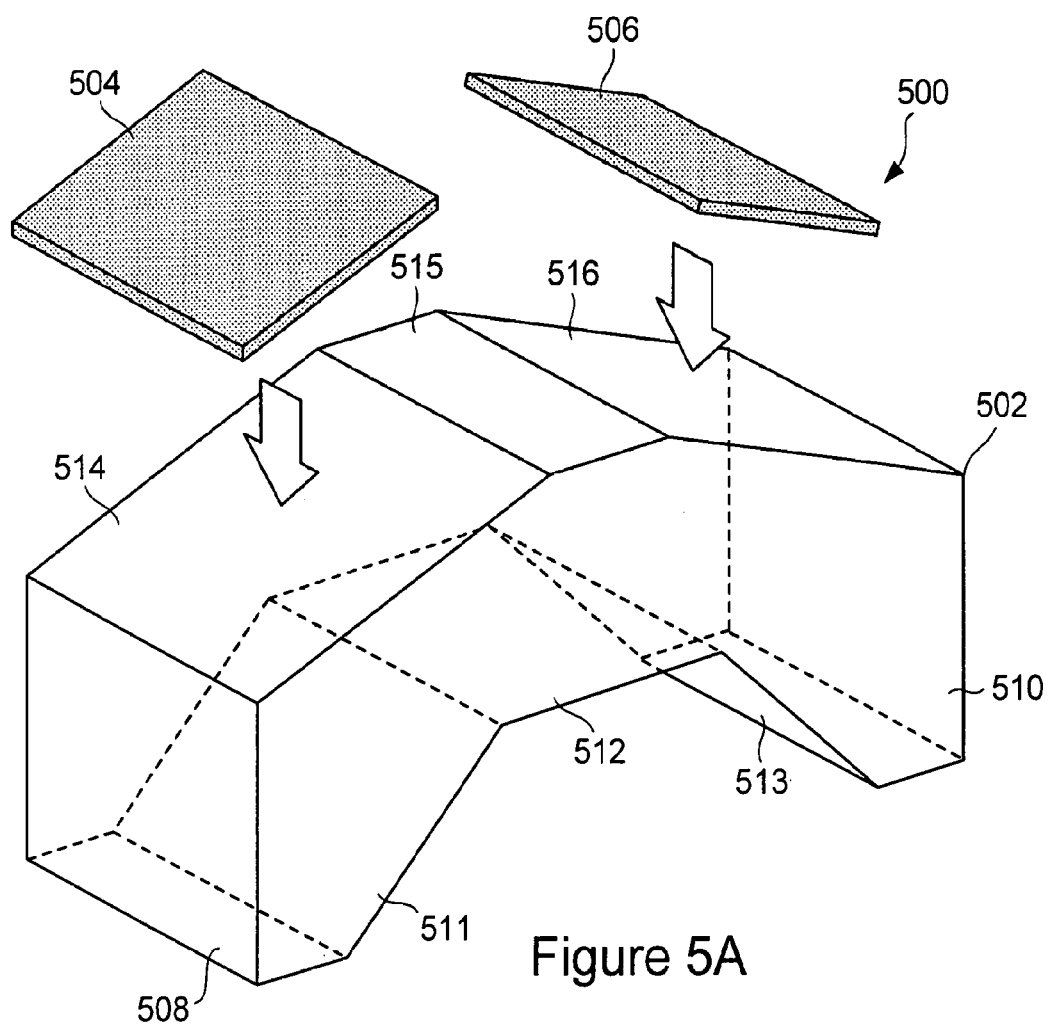
FIG. 5A shows an isometric view of a second image-rotation prism configured in accordance with embodiments of the present invention.
Figure 5B:
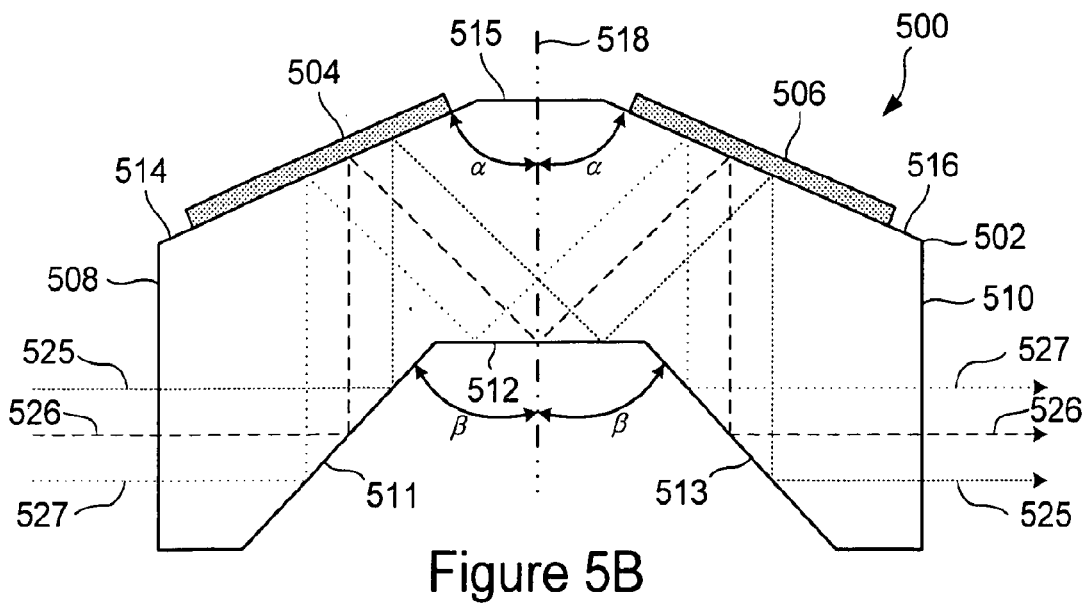
FIG. 5B shows a side-view of the image-rotation prism, shown in FIG. 5A, configured in accordance with embodiments of the present invention.

FIG. 5A shows an isometric view of a second image-rotation prism 500 configured in accordance with embodiments of the present invention. The image-rotation prism 500 includes a prism 502, a first mirror 504, and a second mirror 506. The prism 502 is configured with a first planar surface 508, a second planar surface 510, and intermediate planar surfaces 511-516. The first mirror 504 is disposed on the planar surface 514, and the second mirror 506 is disposed on the planar surface 516. FIG. 5B shows a side-view of the image-rotation prism 500 configured in accordance with embodiments of the present invention. Dashed-line 518 represents a side-view of a plane-of-symmetry positioned perpendicular to the planar surface 512 and bisecting the prism 502. The first and second planar surface 508 and 510 are ideally parallel to the plane 518, the planar surfaces 511 and 513 are also ideally configured with the same angle $\beta$ to the plane 518, and the planar surfaces 514 and 516 are ideally configured with the same angle $\alpha$ to the plane 518.

As shown in FIG. 5B, three different rays 525-527, identified by three different dashed lines, trace a path of portions of a beam of light entering the prism 502 substantially perpendicular to the first planar surface 508. The planar surface 511 is angled so that the rays 525-527 experience TIR at the planar surface 511. The rays 525-527 are reflected toward the planar surface 514 with an angle-of-incidence that is less than the critical angle associated with the planar surface 514. The mirror 504 reflect the rays 525-527 to the planar surface 512 which is angled so that the rays 525-527 experience TIR and are reflected toward the planar surface 516 with an angle-of-incidence that is less than the critical angle associated with the planar surface 516. The mirror 506 reflects the rays 525-527 to the planar surface 513, which is angled so that the rays 525-527 experience TIR and emerge from the prism 502 substantially perpendicular to the second planar surface 510. Note that because the second portion of the rays 525-527 experience five internal reflections, the rays 525-527 emerge from the prism 502 inverted with respect to the incident orientation of the rays 525-527.

Figure 6:
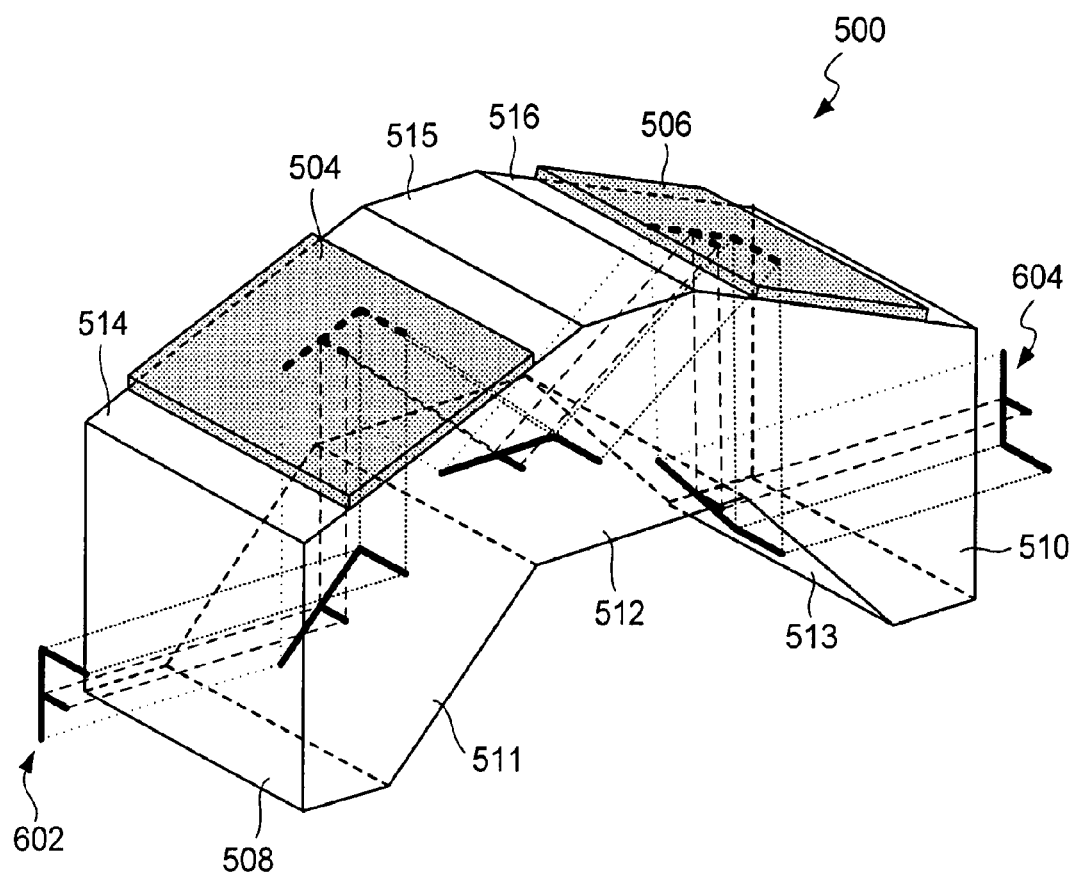
FIG. 6 shows an isometric view of inverting an image using the image-rotation prism, shown in FIG. 5A, in accordance with embodiments of the present invention.

FIG. 6 shows an isometric view of inverting an image using the image-rotation prism 500 in accordance with embodiments of the present invention. The image of the letter "F" 602 enters the prism through the first planar surface 508 and undergoes five internal reflections before emerging from the prism 500 as an inverted image of the letter "F" 604. The internal reflections at the planar surfaces 511-513 are due to TIR, and the internal reflections at the planar surfaces 514 and 516 are due to mirrors 504 and 506.

Figure 7:
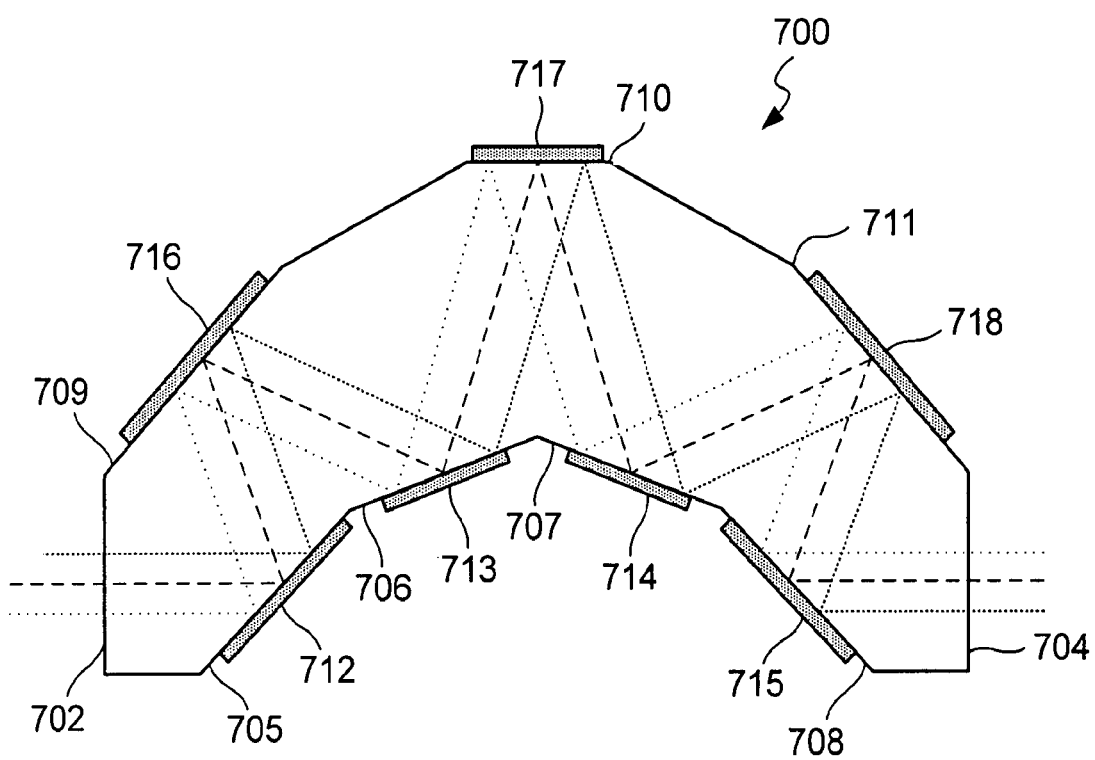
FIG. 7 shows a side-view of a third image-rotation prism configured in accordance with embodiments of the present invention.

The family of image-rotation prisms is not limited to the first image-rotation prism 300 and the second image-rotation prism 500 described above. Other image-rotation prism configurations with a higher odd number of internal reflections are included in the family of image-rotation prisms. For example, FIG. 7 shows a side-view of third image-rotation prism 700 configured in accordance with embodiments of the present invention. The image-rotation prism includes a prism configured with a first planar surface 702, a second planar surface 704, and eight intermediate planar surfaces 705-711. The image-rotation prism 700 also includes seven mirrors 712-718 attached to the planar surfaces 705-711. A number of the mirrors 712-718 may be optional depending on which of the planar surfaces are angled to cause TIR of light transmitted through the prism.

The well-know Dove prism also inverts an image, and when a Dove prism is rotated about the central length axis, the image rotates at twice the rate of rotation of the Dove prism. However, the family of image-rotation prisms of the present invention have a number of advantages over the Dove prism.

Figure 8:
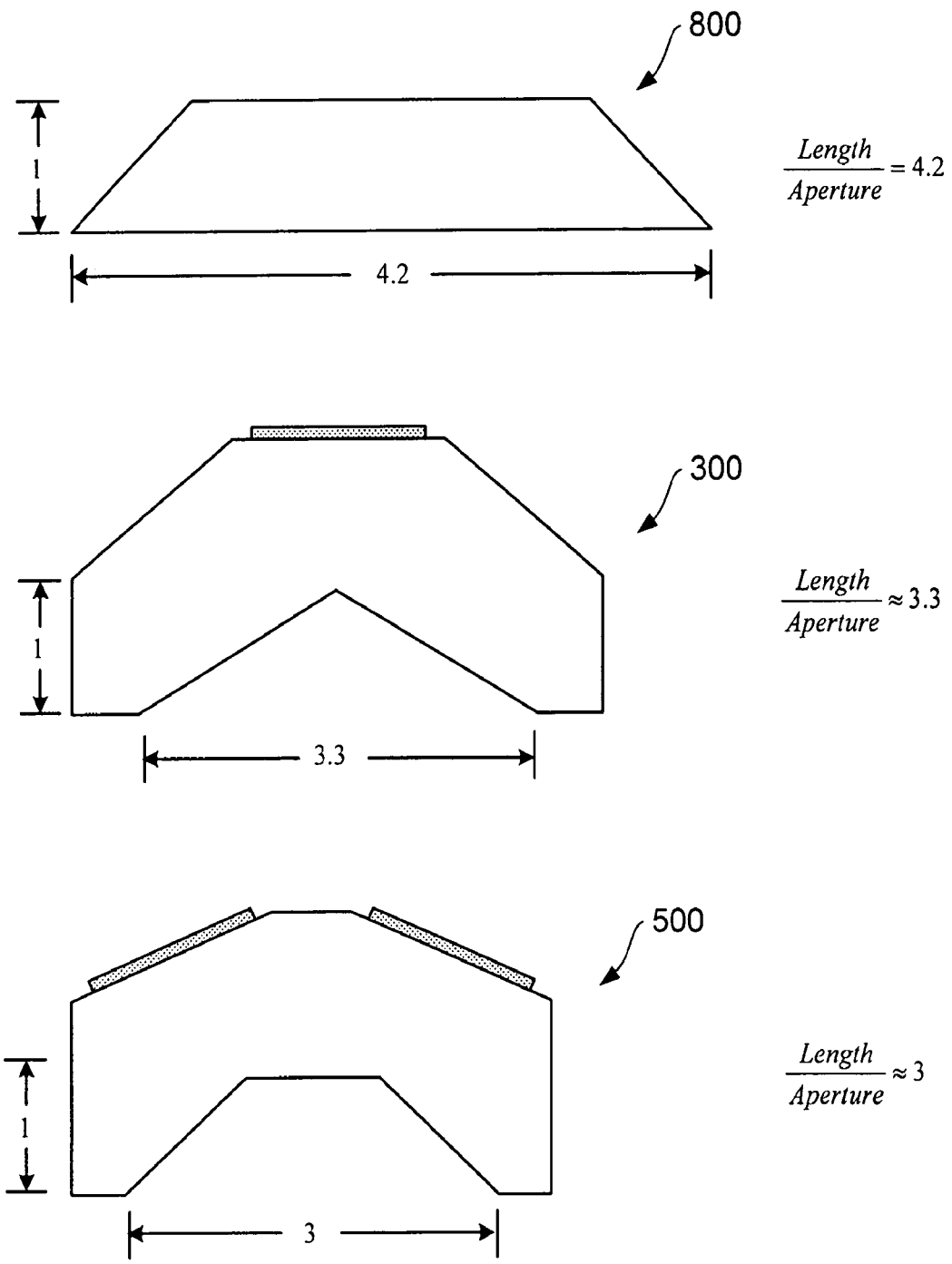
FIG. 8 shows length-to-aperture ratios for two image-rotation prisms configured in accordance with embodiments of the present invention.

First, the overall length-to-aperture ratios of the image-rotation prisms of the present invention are smaller than the length-to-aperture ratio of a dimensionally comparable Dove prism and the length-to-aperture ratio can be adjusted. FIG. 8 shows example length-to-aperture ratios for a Dove prism 800, the first image-rotation prism 300, and the second image-rotation prism 500 in accordance with embodiments of the present invention. Second, the prism portions of the image-rotation prisms can be composed of glass, acrylic, or another suitable transparent dielectric material. Third, the dimensions, shapes, and locations of the mirrors disposed on the intermediate planar surfaces that are not angled to cause TIR can be selected to control the size of the beam of light emerging from the prism.

Figure 9:
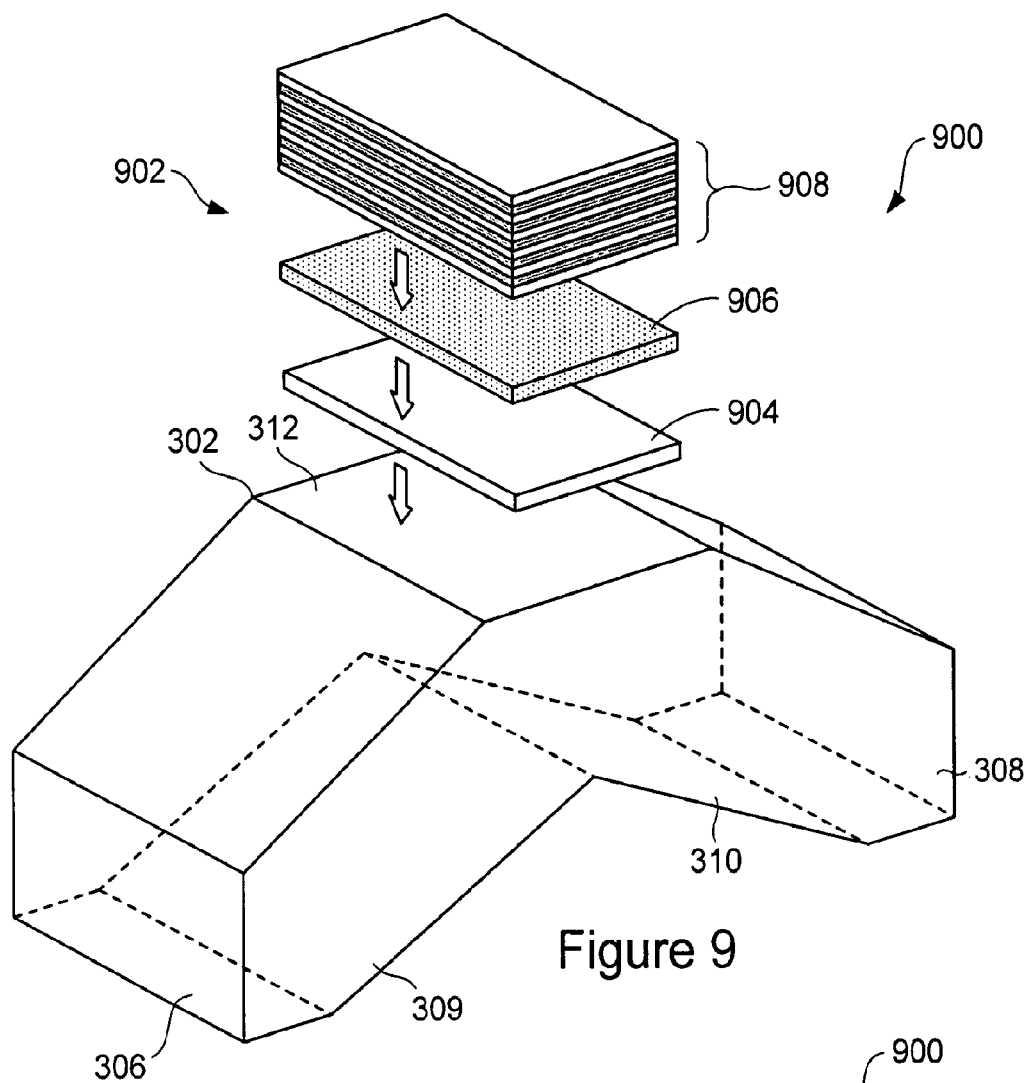
FIG. 9 shows an exploded isometric view of an image-rotation prism with an optical gain system configured in accordance with embodiments of the present invention.

The strength of a beam of light entering the image-rotation prisms may be reduced or scattered. Image-rotation prism embodiments of the present invention can be configured to correct this problem by replacing at least one mirror attached to an intermediate planar surface with an optical gain system. FIG. 9 shows an exploded isometric view of an image-rotation prism 900 with an optical gain system 902 configured in accordance with embodiments of the present invention. The image-rotation prism 900 is identical to the image-rotation prism 300 except the optical gain system 902 replaces the mirror 304. The optical gain system 902 includes a conductive transmission layer 904 that is disposed on the planar surface 312, a gain medium 906 disposed on the conductive transmission layer 904, and a Bragg mirror 908 disposed on the gain medium 906.

In certain embodiments, the conductive transmission layer can be a conductive metal layer, such as copper ("Cu"), aluminum ("Al"), silver ("Ag"), and steal, with at least one hole permitting light reflected off of the planar surface 309 to penetrate the gain medium 906 and the Bragg mirror 908. In other embodiments, the conductive transmission layer can be composed of indium-tin oxide ("ITO"), which features a combination of electrical conductivity and transparency.

The gain medium 906 can be a semiconductor layer, a p-n junction, or a p-i-n junction, and can be composed of an alloy of indirect elemental semiconductor, such as silicon ("Si") and germanium ("Ge"), SiGe alloy that can have direct transitions, or a compound semiconductor, such as a III-V direct bandgap semiconductor, where Roman numerals III and V represent elements in the IIIa and Va columns of the Periodic Table of the Elements. Compound semiconductors can be composed of column IIIa elements, such as Aluminum ("Al"), Gallium ("Ga"), and Indium ("In"), in combination with column Va elements, such as Nitrogen ("N"), Phosphorus ("P"), Arsenic ("As"), and Antimony ("Sb"). Compound semiconductors can be classified according the relative quantities of III and V elements. For example, binary semiconductor compounds include GaAs, InP, InAs, and GaP; ternary compound semiconductors include $GaAs_yP_{1-y}$, where y ranges between 0 and 1; and quaternary compound semiconductors include $In_xGa_{1-x}As_yP_{1-y}$, where both x and y independently range between 0 and 1. Other types of suitable compound semiconductors include II-VI materials, where II and VI represent elements in the IIb and VIa columns of the periodic table. For example, CdSe, ZnSe, ZnS, and ZnO are examples of binary II-VI compound semiconductors.

The Bragg mirror 908 can be composed of alternating layers of low refractive index and relatively higher refractive index semiconductor materials. For example, unshaded layers can be composed of semiconductor materials having a relatively higher refractive index than shaded layers. In particular, the shaded layers can be composed of AlGaAs separating the higher effective refractive index unshaded layers composed of GaAs. The thickness of the layers forming the Bragg mirror 908 can be selected to reflect light of particular wavelength transmitted through the prism 302 and emitted from the gain medium 906. This can be accomplished by selecting the thickness of the layers in accordance with:

$$\text{Thickness} = \frac{\lambda}{4n_{\text{eff}}}$$

where λ is the selected wavelength of light transmitted through the prism 302 and emitted from the gain medium 906, and $n_{\text{eff}}$ is the effective refractive index of the layers. The Bragg mirror 908 is configured to operate as a filter that reflects light over a range of wavelengths centered about the wavelength λ.

Figure 10:
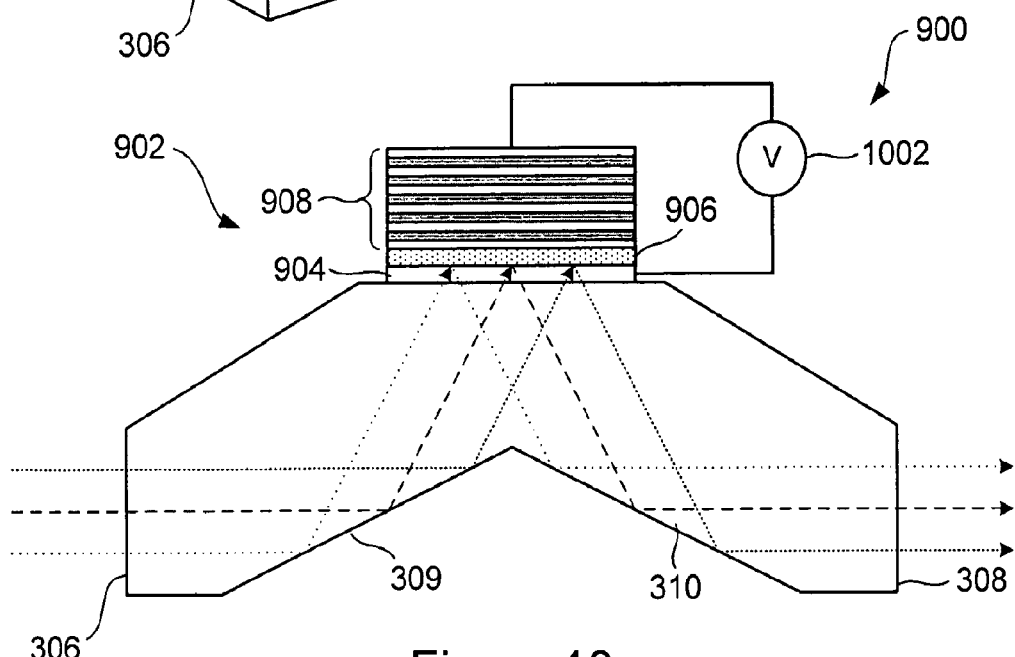
FIG. 10 shows a schematic representation of the image-rotation prism, shown in FIG. 9, configured in accordance with embodiments of the present invention.

FIG. 10 shows a schematic representation of the image-rotation prism 900 configured in accordance with embodiments of the present invention. The optical gain system 902 can be operated by applying an appropriate voltage bias from a voltage source 1002. Electrons are injected from the voltage source 1002 into the conduction band of the gain medium 906, and holes are injected into the valence band of the gain medium 906. As a result, there is a high density of electrons in the conduction band of the gain medium 906 and a corresponding high density of holes in the valence band of the gain medium 906. As long as an appropriate voltage is applied to the gain medium 906, high densities of electrons and holes are maintained in the gain medium 906, and the electrons and holes can spontaneously recombine at the gain medium 906 producing photons with a wavelength λ satisfying the condition, hc/λ□$E_g$, where $E_g$ is the electronic bandgap of the gain medium 906. The gain medium 906 can be selected so that the wavelength of light λ emitted from electrons-hole pair recombination substantially matches the wavelength of the beam of light transmitted through the image-rotation prism. Photons of the beam of light entering the prism can also stimulate the production of more light from the gain medium 906 in addition to the already spontaneously emitted light. The signal beam can be amplified by traversing the gain medium and can increase the signal level to overcome any optical insertion losses. As described above, the Bragg mirror 908 can be fabricated with appropriate layer thicknesses to reflect the light emitted from the gain medium 906 into the prism 302.

Figure 11:
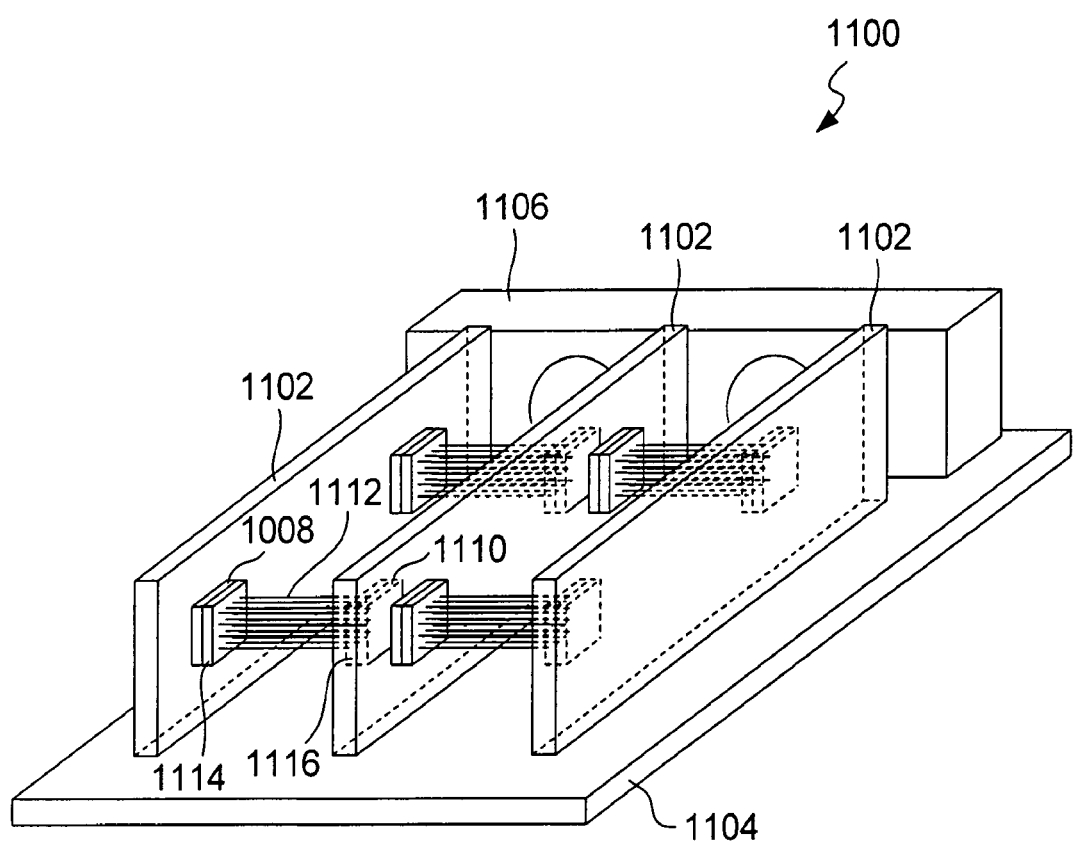
FIG. 11 shows a server system employing optical signals in accordance with an embodiment of the invention.

FIG. 11 shows a server system 1100 employing optical communication channels in accordance with embodiments of the invention. The server system 1100 includes blades 1102 that are mounted on a shared backplane 1104. Additional components 1106 such as power supply transformers and cooling fans can also be connected to backplane 1104, and the entire assembly can be contained in a shared enclosure (not shown). A user interface and sockets for external connections to the server system 1100 may be provided through the shared enclosure.

Some or all of the blades 1102 can be substantially identical or of differing designs to perform different functions. For example, the blades 1102 can be server blades or storage blades. Each blade includes one or more subsystems (not shown) that implement the particular functions of the blade. The subsystems may be mounted on either one or both sides of each blade in the manner of components on a printed circuit board, or the blades 1102 can include enclosures with the subsystems located inside. Typical examples of subsystems include hard drives or other data storage and processor subsystems containing conventional computer components such as microprocessors, memory sockets, and integrated circuit memory. The subsystems and the general features of the blades 1102 can be of conventional types known for server systems using blade architectures.

Each of the blades 1102 can additionally include one or more arrangements of transmitters 1108 and one or more arrangement of detectors 1110. Each transmitter arrangement 1108 is positioned on a blade 1102 to be substantially aligned with a corresponding detector arrangement 1110 on a neighboring blade 1102 when the blades 1102 are properly mounted on the backplane 1104. In a typical configuration for server system 1100, there may be about 5 cm of free space between the transmitter arrangement 1108 and the corresponding detector arrangement 1110. Each detector arrangement 1110 may be subject to translational misalignment on the order of about 500-1000 µm and angular misalignment of about 1.5° relative to the corresponding transmitter arrangement 1108 due to variations in the mechanical mounting of the blades 1102. Additionally, the alignment of corresponding transmitters arrangements 1114 and detector arrangements 1110 may be subject to variations on the order of 40 to 50 µm and up to ±1-3° due to fabrication tolerances, temperature variations, and/or mechanical vibrations, for example, from the operation of cooling fans or hard drives.

The transmitters in the transmitter arrangement 1108 are light sources, such as vertical cavity surface emitting lasers ("VCSELs") or light emitting diodes ("LEDs"), that can be integrated into or on an integrated circuit die. Each light source emits a beam of light 1112 that can be independently modulated to encode data for transmission at a data rate as high as about 10 Gb/s. A data encoded beam of light emitted from a light source in the transmitter arrangement 1108 is called an "optical signal."

The detectors of the detector arrangement 1110 can be photodiodes. For example, a detector can be a photodiode with a light sensitive area of a size selected according to the data rate of the optical signal received at the photodiodes. For a data rate of 10 Gb/s or larger the width of light sensitive area generally needs to be less than about 40 µm across.

An optical transmitter system 1114 adjacent to each transmitter arrangement 1108 and a corresponding optical receiver system 1116 adjacent to each detector arrangement 1110 compose an optical system for providing board-to-board communication. As described further below with reference to FIG. 12, elements of the optical transmitter system 1114 and the optical receiver system 1116 form a portion of an optical system, that forms an image of the transmitter arrangement 1108 on the detector arrangement 1110. As a result, detectors in the detector arrangement 1110 receive respective optical signals 1112 from transmitters in the transmitter arrangement 1108. The telecentricity provided by a pair of systems 1114 and 1116 makes the optical communication channels between the transmitter arrangement 1108 and the detector arrangement 1110 tolerant of variations in the separation between the transmitter arrangement 1108 and the detector arrangement 1110.

In one embodiment, for example, the systems 1114 and 1116 can be dynamically adjusted. The optical transmitter system 1114 includes one or more optical elements in mountings that are mechanically coupled to actuators that are capable of moving the optical elements so that a control system (not shown) can adjust the direction or position of optical signals output from transmitters of the transmitter arrangement 1108. The optical receiver system 1116 also includes one or more optical elements in mountings that are mechanically coupled to actuators that are capable of moving the optical elements so that a control system (not shown) can adjust the direction or position of the optical elements in order to direct the optical signals onto the detectors of the detector arrangement 1110. In certain embodiments, the optical transmitter system 1114 can be fixed during operation, and the optical receiver system 1116 dynamically adjusts during transmissions of the optical signals to maintain transmitter-detector alignment. In other embodiments, the optical receiver system 1116 can be fixed during operation, and the optical transmitter system 1114 dynamically adjusts during transmissions of the optical signals to maintain transmitter-detector alignment.

Communications established between blades 1102 can be used to coordinate dynamic operation of the optical system 1114 and 1116. Alignment data can be carried on a lower data rate electrical channel or as part of the data on any optical signal transmitted between blades 1102. Transmission of alignment data may be unnecessary in embodiments where the optical transmitter system 1114 is fixed and only the optical receiver system 1116 performs the dynamic alignment. However, beam control from the optical transmitter system 1114 can provide a geometric advantage that may permit use of smaller (and therefore less expensive) optical elements in the optical receiver system 1116 than would be required if the optical receiver system 1116 alone corrected for misalignment.

Figure 12:
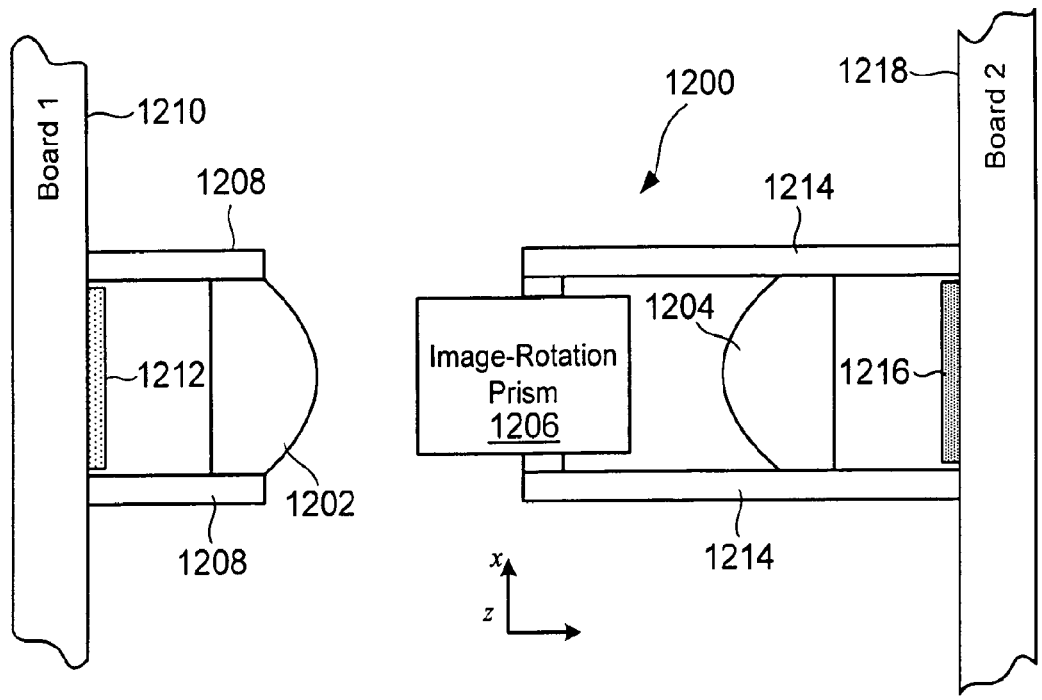
FIG. 12 shows a schematic representation of a system for providing board-to-board optical communication in accordance with embodiments of the present invention.

FIG. 12 shows a schematic representation of an optical system 1200 for providing board-to-board optical communication in accordance with embodiments of the present invention. The optical system 1200 can have a unity image magnification and is composed of a first lens 1202, a second lens 1204, and an image-rotation prism 1206 disposed between the first lens 1202 and the second lens 1204. As shown in FIG. 12, the first and second lenses 1202 and 1204 are plano-convex lenses that are positioned with the convex portions of the lenses facing each other. The optical system 1200 includes a first mounting system 1208 that attaches the first lens 1202 to a first board 1210. The planar surface of the first lens 1202 faces an arrangement of transmitters 1212 that are electronically coupled to and disposed on the first board 1210. The optical system 1200 also includes a second mounting system 1214 that attaches the second lens 1204 and the image-rotation prism 1206 to a second board 1216. The planar surface of the second lens 1204 faces an arrangement of detectors 1216 that are electronically coupled to and disposed on the second board 1218. The second mounting system 1214 also positions the image-rotation prism 1206 in the path of optical signals transmitted output from an arrangement of transmitters 12 between the first lens 1202 and the second lens 1204. The first mounting system 1208 is mechanically coupled to a first actuator (not shown), and the mounting system 1210 is mechanically coupled to a second actuator (not shown) where the first and second actuators adjusts the position and/or orientation of the lenses to compensate for tilt misalignment. The second mounting system 1214 can include a third actuator that adjusts the orientation of the image-rotation prism 1206 via the second mounting system 1214 to compensate for arbitrary axial rotation and misalignment of optical signals output from the transmitter arrangement 1212 to the detector arrangement 1216. In other embodiments, rather than using the second mounting system 1214 to support and control the position of the image-rotation prism 1206, the system 1200 can include a third mounting system that supports and positions the image-rotation prism 1206.

In alternate embodiments, a second optical system can be composed of just one plano-convex that directs optical signals onto the image-rotation prism 1206. The entire second optical system can be controlled by a single mounting system or the focusing of the piano-convex lens and the prism can be accomplished via two mounting systems, each mounting system disposed on a different board.

Figure 13:
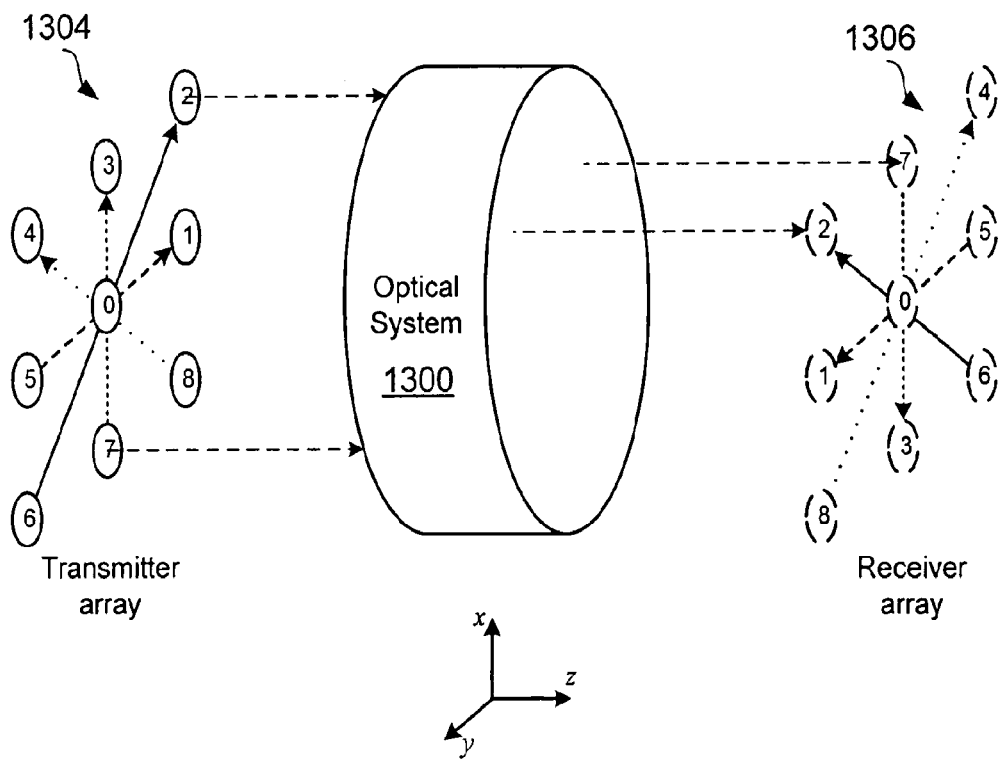
FIG. 13 shows operation of a system of lenses configured in accordance with the embodiments of the present invention.

FIG. 13 shows operation of an optical system 1300 configured in accordance with embodiments of the present invention. The transmitters are arranged in a transmitter array 1304 and the corresponding detectors are arranged in a detector array 1306. The transmitter array 1304 and the detector array 1305 lie in the xy-plane. The transmitters in the transmitter array 1304 output optical signals approximately parallel to the z-axis. The optical system 1300 directs optical signals output from the transmitters to corresponding detectors of the detector array 1306. The optical signals pass through the optical system 1300 before reaching corresponding detectors of the detector array 1306. The individual transmitters in the transmitter array 1304 and the individual detectors in the detector array 1306 are numerically labeled 1-9 to identify corresponding transmitters and detectors. For example, in the case of the optical system 1200, optical signals output from the transmitter 2 and 7 pass through the lens 1202 and 1204 and the image-rotation prism 1206 and are incident on corresponding detectors 2 and 7, respectively.

Figure 14:
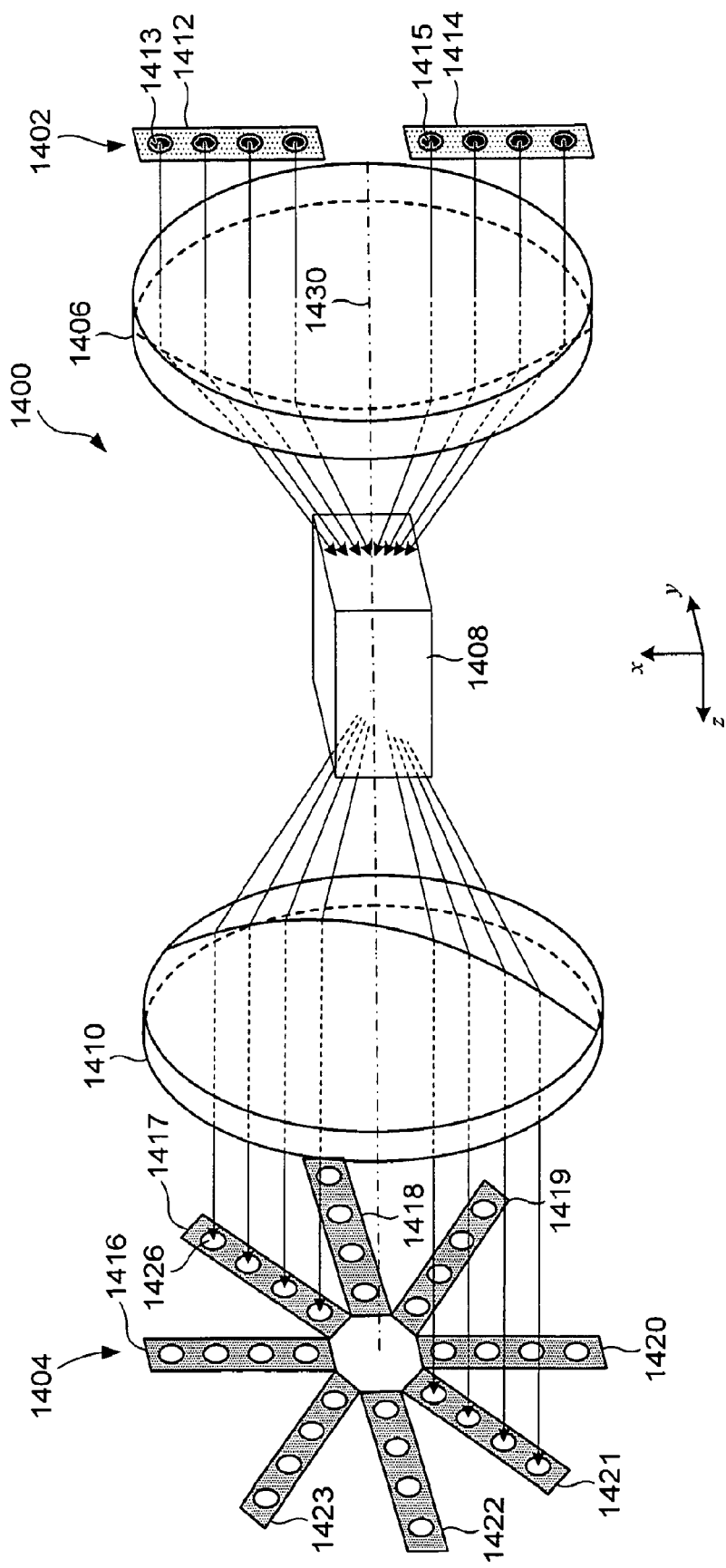
FIG. 14 shows a system with an image-rotation prism that directs optical signals onto particular detectors in accordance with embodiments of the present invention.

In other embodiments, the image-rotation prism can be rotated to direct optical signals onto particular subsets of detectors of an arrangement of detectors. FIG. 14 shows portions of an optical system 1400 with an image-rotation prism that directs optical signals onto particular detectors in accordance with embodiments of the present invention. The lens and image-rotation prism of the optical system 1400 are positioned between a transmitter arrangement 1402, a detector arrangement 1404. The optical system 1400 is composed of a first piano-convex lens 1406, an image-rotation prism 1408, and a second plano-convex lens 1410. The system 1400 also includes mounting systems (not shown) for supporting and controlling the orientation of the lenses 1406 and 1410 and the image-rotation prism 1408. The transmitters of the transmitter arrangement 1402 are arranged in two sets of four in-line transmitters 1412 and 1414. For example, in-line transmitter 1412 is composed a four transmitters, such as transmitter 1413, and in-line transmitter 1414 is composed of four transmitters, such as transmitter 1415. The detectors of the detector arrangement 1404 are arranged in sets of four in-line detectors 1416-1423 that fan-out in a manner similar to spokes of a wheel. For example, in-line detector 1417 includes four detectors, such as detector 1426. The spacing of each detector in the in-line detectors substantially matches the spacing of each transmitter in the in-line transmitters. Each in-line detector corresponds to a particular channel of optical signals. The image-rotation prism 1408 is rotated about a central axis 1430 so that optical signals output from the in-line transmitters 1412 and 1414 are directed to a particular pair of in-line detectors. For example, as shown in FIG. 14, the image-rotation prism 1408 is oriented so that eight optical signals output from the in-line transmitters 1412 and 1414 pass through the first lens 1406, the image-rotation prism 1408, the second lens 1410 and are received by the in-line detectors 1417 and 1421. The image-rotation prism 1408 can be rotated about the central axis 1430 to a different orientation so that eight optical signals can be detected by a different pair of in-line detectors, such as in-line detectors 1423 and 1419.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An image-rotation prism, comprising:
a prism having a first planar surface, a second planar surface, and a plurality of intermediate planar surfaces, wherein the first and second planar surfaces are approximately parallel and located at opposite ends of the prism, and the intermediate planar surfaces are angled so that an image incident on the first planar surface is internally reflected by the intermediate planar surfaces and exits the prism through the second planar surface inverted with respect to the orientation of the incident image; and
at least one reflective structure disposed on at least one intermediate planar surface,
wherein the reflective structure further comprises an optical gain system that compensates for insertion loss of the image.

2. The image-rotation prism of claim 1,
wherein the plurality of intermediate planar surfaces includes three or more intermediate planar surfaces.

3. The image-rotation prism of claim 1 wherein the prism rotated through an angle θ about an imaginary axis extending approximately perpendicular to the first and second planar surfaces rotates the image emerging from the second planar surface through an angle 2θ.

4. The image-rotation prism of claim 1, wherein the prism further comprises the planar surfaces positioned so that the path of the image emerging from the prism through the second planar surface is substantially parallel to the path of the image incident on the first planar surface.

5. The image-rotation prism of claim 1, wherein one or more of the intermediate planar surfaces are angled with respect to the path of the image transmitted through the prism so that the image experiences total internal reflection.

6. The image-rotation prism of claim 1, wherein the at least one reflective structure further comprises a mirror attached to the outside surface of the at least one intermediate planar surface.

7. A system of comprising:
a plurality of transmitters coupled to a first subsystem, wherein each transmitter generates an optical signal that is transmitted through free space;
a first lens through which the plurality of optical signals pass, the first lens coupled to the first subsystem;
a plurality of detectors coupled to a second subsystem, wherein at least a portion of the detectors correspondingly receive the optical signals;
a second lens through which the plurality of optical signals pass, the second lens coupled to the second subsystem;
an image-rotation prism disposed between the first lens and the second lens through which the plurality of optical signals pass; wherein the first lens, the second lens, and the image-rotation prism in combination form an image of the plurality of transmitters on the at least a portion of the detectors,
wherein the plurality of detectors further comprises detectors arranged in a spoke and wheel pattern.

8. The image-rotation prism of claim 1 wherein the optical gain system further comprises:
a electrical contact disposed on at least one intermediate planar surface;
a gain medium disposed on the electrical contact; and
a Bragg mirror disposed on the gain medium having layers configured and oriented to reflect the image and the amplified signal from the gain medium into the prism.

9. The image-rotation prism of claim 8 wherein the electrical contact further comprises one of:
indium-tin oxide; and a metal having one or more holes.

10. The system of claim 7,
wherein the image-rotation prism further comprises:
a prism having a first planar surface, a second planar surfaces, and a plurality of intermediate planar surfaces, wherein the first and second planar surfaces are positioned substantially parallel to one another at opposite ends of the prism, and the intermediate planar surfaces are angled so that an image incident on the first planar surface is internally reflected by three or more of the intermediate planar surfaces and emerges inverted with respect to the orientation of the incident image through the second planar surface.

11. The system of claim 7, further comprises a third mounting system that disposes the image-rotation prism between the first lens and the second lens.

12. The system of claim 11 wherein a mounting system is coupled to to the first subsystem or the second subsystem.

13. The system of claim 11 wherein the mounting system dynamically rotates the image-rotation prism to align the optical signals with a selected portion of the detectors.

14. The system of claim 7, wherein the plurality of transmitters further comprises at least one array of transmitters.

15. The system of claim 7, wherein the plurality of detectors further comprises at least one array of detectors.

16. The system of claim 7, wherein the first lens and the second lens further comprise plano-convex lenses positioned so that the convex portions of the plano-convex lenses face each other.

17. The system of claim 7, wherein the first subsystem further comprises a first blade server, the second system further comprise a second blade server, and the optical signals are transmitted through free space between the first blade server and the second blade server.

18. The system of claim 7, wherein the image-rotation prism further comprises:
a prism having a first planar surface, a second planar surfaces, and a plurality of intermediate planar surfaces, wherein the first and second planar surfaces are positioned substantially parallel to one another at opposite ends of the prism, and the intermediate planar surfaces are angled so that an image incident on the first planar surface is internally reflected by three or more of the intermediate planar surfaces and emerges inverted with respect to the orientation of the incident image through the second planar surface; and
at least one reflective structure disposed on at least one intermediate planar surface so that the image experiences total internal reflection within the prism.

19. The system of claim 7, wherein the prism rotated through an angle θ about an imaginary axis extending substantially perpendicular to the first and second planar surfaces rotates the image emerging from the second planar surface through an angle 2θ.

20. A system, comprising:
a plurality of transmitters coupled to a first subsystem, wherein each transmitter generates an optical signal that is transmitted through free space;
a first lens through which the plurality of optical signals pass, the first lens coupled to the first subsystem;
a plurality of detectors coupled to a second subsystem, wherein at least a portion of the detectors correspondingly receive the optical signals;
a second lens through which the plurality of optical signals pass, the second lens coupled to the second subsystem;
an image-rotation prism disposed between the first lens and the second lens through which the plurality of optical signals pass; wherein the first lens, the second lens, and the image-rotation prism in combination form an image of the plurality of transmitters on the at least a portion of the detectors,
wherein the reflective structure further comprises an optical gain source that compensates for insertion loss of the image.

* * * * *

UNITED STATES PATENT AND TRADEMARK OFFICE
CERTIFICATE OF CORRECTION

| | | |
|---|---|---|
| PATENT NO. | : 8,660,432 B2 | Page 1 of 1 |
| APPLICATION NO. | : 12/922098 | |
| DATED | : February 25, 2014 | |
| INVENTOR(S) | : Huei Pei Kuo et al. | |

It is certified that error appears in the above-identified patent and that said Letters Patent is hereby corrected as shown below:

In the Claims

Column 11, line 31, in Claim 3, delete "claim 1" and insert -- claim 1, --, therefor.

Column 11, line 49, in Claim 7, delete "system of" and insert -- system, --, therefor.

Column 12, line 29, in Claim 12, delete "to to" and insert -- to --, therefor.

Signed and Sealed this
Second Day of September, 2014

Michelle K. Lee
*Deputy Director of the United States Patent and Trademark Office*